United States Patent
Mitrovic et al.

(10) Patent No.: US 9,273,395 B2
(45) Date of Patent: Mar. 1, 2016

(54) GAS TREATMENT SYSTEMS

(75) Inventors: Bojan Mitrovic, Somerset, NJ (US);
Alex Gurary, Bridgewater, NJ (US);
Eric A. Armour, Pennington, NJ (US)

(73) Assignee: Veeco Instruments Inc., Plainview, NY (US)

( * ) Notice: Subject to any disclaimer, the term of this patent is extended or adjusted under 35 U.S.C. 154(b) by 1372 days.

(21) Appl. No.: 12/951,361

(22) Filed: Nov. 22, 2010

(65) Prior Publication Data
US 2011/0091648 A1 Apr. 21, 2011

Related U.S. Application Data

(62) Division of application No. 12/008,705, filed on Jan. 11, 2008, now Pat. No. 8,152,923.

(60) Provisional application No. 60/880,243, filed on Jan. 12, 2007.

(51) Int. Cl.
*C23C 16/455* (2006.01)

(52) U.S. Cl.
CPC ..... *C23C 16/45565* (2013.01); *C23C 16/45574* (2013.01)

(58) Field of Classification Search
CPC ...... C23C 16/06; C23C 16/30; C23C 16/301; C23C 16/305; C23C 16/306; C23C 16/455; C23C 16/45517; C23C 16/45565; C23C 16/45574; C23C 16/4582; C23C 16/4583; C23C 16/4584
USPC ......... 118/715; 156/345.33, 345.34; 427/255.23; 216/15
See application file for complete search history.

(56) References Cited

U.S. PATENT DOCUMENTS

| | | |
|---|---|---|
| 4,854,263 A | 8/1989 | Chang et al. |
| 4,993,358 A | 2/1991 | Mahawili |
| 5,269,847 A | 12/1993 | Anderson |
| 6,098,568 A | 8/2000 | Raoux et al. |
| 6,197,121 B1 | 3/2001 | Gurary et al. |
| 6,921,437 B1 | 7/2005 | DeDontney et al. |

(Continued)

FOREIGN PATENT DOCUMENTS

| | | |
|---|---|---|
| CN | 1693535 A | 11/2005 |
| CN | 1828825 A | 9/2006 |

(Continued)

OTHER PUBLICATIONS

Office Action from corresponding Chinese Application No. 201110021659.1 dated Oct. 10, 2012.

(Continued)

*Primary Examiner* — Jeffrie R Lund
(74) *Attorney, Agent, or Firm* — Lerner, David, Littenberg, Krumholz & Mentlik, LLP

(57) ABSTRACT

An MOCVD reactor such as a rotating disc reactor (10) is equipped with a gas injector head having diffusers (129) disposed between adjacent gas inlets. The diffusers taper in the downstream direction. The injector head desirably has inlets (117) for a first gas such as a metal alkyl disposed in radial rows which terminate radially inward from the reactor wall to minimize deposition of the reactants on the reactor wall. The injector head desirably also has inlets (125) for a second gas such as ammonia arranged in a field between the rows of first gas inlets, and additionally has a center inlet (135) for the second gas coaxial with the axis of rotation.

19 Claims, 5 Drawing Sheets

(56) References Cited

U.S. PATENT DOCUMENTS

| | | | |
|---|---|---|---|
| 7,416,635 B2 | 8/2008 | Moriya et al. | |
| 7,435,445 B2 | 10/2008 | Shin et al. | |
| 7,479,303 B2 | 1/2009 | Byun | |
| 7,922,863 B2 | 4/2011 | Ripley et al. | |
| 8,152,923 B2 * | 4/2012 | Mitrovic et al. | 118/715 |
| 8,287,646 B2 * | 10/2012 | Mitrovic et al. | 118/715 |
| 8,298,370 B2 * | 10/2012 | Byun | 156/345.34 |
| 8,303,713 B2 * | 11/2012 | Belousov et al. | 118/715 |
| 8,617,349 B2 * | 12/2013 | Law et al. | 156/345.34 |
| 8,636,847 B2 * | 1/2014 | Belousov et al. | 118/715 |
| 8,895,107 B2 * | 11/2014 | Gurary et al. | 427/255.28 |
| 8,937,000 B2 * | 1/2015 | Gurary et al. | 438/478 |
| 2003/0037880 A1 | 2/2003 | Carducci et al. | |
| 2004/0060514 A1 | 4/2004 | Janakiraman et al. | |
| 2004/0082171 A1 | 4/2004 | Shin et al. | |
| 2005/0011436 A1 | 1/2005 | Liu | |
| 2006/0011298 A1 | 1/2006 | Lim et al. | |
| 2006/0021574 A1 | 2/2006 | Armour et al. | |
| 2006/0121193 A1 | 6/2006 | Strauch et al. | |
| 2006/0196604 A1 | 9/2006 | Moriya et al. | |
| 2006/0199131 A1 | 9/2006 | Kawasaki et al. | |
| 2006/0263522 A1 * | 11/2006 | Byun | 427/248.1 |
| 2007/0095284 A1 | 5/2007 | Iizuka et al. | |
| 2007/0141257 A1 | 6/2007 | Takahashi et al. | |
| 2007/0218701 A1 * | 9/2007 | Shimizu et al. | 438/758 |
| 2007/0218702 A1 * | 9/2007 | Shimizu et al. | 438/758 |
| 2008/0099147 A1 | 5/2008 | Myo et al. | |
| 2008/0152840 A1 | 6/2008 | Ripley et al. | |
| 2008/0166884 A1 | 7/2008 | Nelson et al. | |
| 2008/0173735 A1 | 7/2008 | Mitrovic et al. | |
| 2009/0178614 A1 | 7/2009 | Kasai et al. | |
| 2009/0178616 A1 | 7/2009 | Byun | |
| 2010/0112216 A1 * | 5/2010 | Gurary et al. | 427/255.28 |
| 2010/0143588 A1 | 6/2010 | Belousov et al. | |
| 2010/0300359 A1 * | 12/2010 | Armour et al. | 118/724 |
| 2011/0088623 A1 | 4/2011 | Mitrovic et al. | |
| 2011/0091648 A1 | 4/2011 | Mitrovic et al. | |
| 2011/0215071 A1 | 9/2011 | Mitrovic et al. | |
| 2012/0027936 A1 | 2/2012 | Gurary | |
| 2012/0040514 A1 * | 2/2012 | Gurary et al. | 438/478 |
| 2012/0325151 A1 * | 12/2012 | Belousov et al. | 118/730 |
| 2014/0116330 A1 * | 5/2014 | Belousov et al. | 117/98 |
| 2014/0352619 A1 * | 12/2014 | Gurary et al. | 118/724 |
| 2014/0360430 A1 * | 12/2014 | Armour | C30B 25/105 118/725 |
| 2015/0056790 A1 * | 2/2015 | Gurary et al. | 438/478 |
| 2015/0225875 A1 * | 8/2015 | Mitrovic | C23C 16/45563 118/729 |

FOREIGN PATENT DOCUMENTS

| | | |
|---|---|---|
| CN | 1860252 A | 11/2006 |
| JP | 2005-294421 | 10/2005 |
| WO | 2005019496 A1 | 3/2005 |

OTHER PUBLICATIONS

Office Action from corresponding Chinese Application No. 20088005064.3 dated Mar. 20, 2012.

International Search Report, PCT/US2008/000402.

\* cited by examiner

GAS TREATMENT SYSTEMS

CROSS-REFERENCE TO RELATED APPLICATIONS

The present application is a divisional application of U.S. patent application Ser. No. 12/008,705, filed Jan. 11, 2008, which application claims the benefit of the filing date of U.S. Provisional Patent Application No. 60/880,243, filed Jan. 12, 2007, the disclosure of which is incorporated herein by reference.

BACKGROUND OF THE INVENTION

This invention relates to systems for reactive gas phase processing such as chemical vapor deposition.

Chemical vapor deposition ("CVD") reactors permit the treatment of substrates such as wafers mounted on a wafer carrier inside a reaction chamber. A component referred to as a gas distribution injector or injector head is mounted facing towards the wafer carrier. The injector typically includes a plurality of gas inlets that provide some combination of gases to the chamber for chemical vapor deposition. Some gas distribution injectors provide a shroud or carrier gases that assist in providing a laminar gas flow during the chemical vapor deposition process, where the carrier gas typically does not participate in chemical vapor deposition. Many gas distribution injectors have showerhead designs including gas inlets spaced in a pattern on the head.

A gas distribution injector typically permits the direction of precursor gases from gas inlets on an injector surface towards certain targeted regions of the reaction chamber where wafers can be treated for processes such as epitaxial growth of material layers. Ideally, the precursor gases are directed at the wafer carrier in such a way that the precursor gases react as close to the wafers as possible, thus maximizing reaction processes and epitaxial growth at the wafer surface.

In many metal organic chemical vapor deposition (MOCVD) processes, for example, combinations of precursor gases comprised of metal organics and hydrides, such as ammonia or arsine, are introduced into a reaction chamber through the injector. Process-facilitating carrier gases, such as hydrogen, nitrogen, or inert gases, such as argon or helium, also may be introduced into the reactor through the injector. The precursor gases mix in the reaction chamber and react to form a deposit on a wafer held within the chamber. The carrier gases typically aid in maintaining laminar flow at the wafer carrier.

In this way, epitaxial growth of semiconductor compounds such as, GaAs, GaN, GaAlAs, InGaAsSb, InP, ZnSe, ZnTe, HgCdTe, InAsSbP, InGaN, AlGaN, SiGe, SiC, ZnO and InGaAlP, and the like, can be achieved. Other gas treatment processes are performed for purposes other than epitaxial growth such as, for example, etching.

However, many existing gas injector systems have problems that may interfere with efficient operation or uniform deposition. For example, precursor injection patterns in existing gas distribution injector systems may contain significant "dead space" (space without active flow from gas inlets on the injector surface) resulting in recirculation patterns near the injector.

These recirculation patterns may result in prereaction of the precursor chemicals, causing unwanted deposition of reaction products on the injector. Additionally, unwanted deposition may occur on the wall of the reaction chamber. Such unwanted deposition consumes reactants and decreases the efficiency and reproducibility of the process. Moreover, reaction products deposited on the injector or on the reactor wall can be dislodged and can contaminate the substrates being processed. Thus, many current systems require frequent cleaning of the reactor, which further reduces productivity.

Considerable effort has been devoted in the art to achieving uniform reaction conditions over the entire extent of the wafer carrier, to assure that the deposited layers grow uniformly on all of the substrates. Another desire is to assure that the process gases supplied to all regions of the reactor are used efficiently and are not wasted. However, still further improvements in these aspects of operation would be desirable.

Thus, despite all of the efforts in this area, further improvement would be desirable.

SUMMARY OF THE INVENTION

One aspect of the invention provides an injector head for a gas treatment reactor. The head according to this aspect of the invention desirably includes a structure defining a plurality of gas inlets having openings facing in a downstream direction. The head further desirably includes diffuser elements disposed between adjacent ones of the gas inlets, the diffuser elements extending in the downstream direction from the gas inlets and tapering in the downstream direction. As further discussed below, the diffuser elements can suppress recirculation of the gases in the vicinity of the injector head.

A further aspect of the invention provides a reactor for gas treatment of one or more substrates with at least a first gas and a second gas. The reactor according to this aspect of the invention desirably includes a reaction chamber and a substrate holder for supporting the one or more substrates. The substrate holder desirably is mounted within the reactant chamber for rotation about an axis extending in upstream and downstream directions. The reactor according to this aspect of the invention desirably also includes an injector head disposed upstream of the substrate holder. The injector desirably has structure defining a plurality of first gas inlets, the first gas inlets being disposed in a first row extending in a first radial direction perpendicular to the axis and in a second row extending in a second radial direction perpendicular to the axis and perpendicular to the first radial direction. The injector head also desirably includes a plurality of second gas field inlets, the second gas field inlets being disposed in quadrants of the injector head around the axis between the rows of first gas inlets. Optionally, the injector head further defines a center second gas inlet disposed at the axis.

The rows of first gas inlets desirably terminate inwardly of the wall of the reaction chamber. Stated another way, the rows of first gas inlets desirably extend to a first radial distance from the axis, whereas the second gas field inlets desirably extend to a second radial distance from the axis, the first radial distance being less than the second radial distance. As discussed further below, this arrangement can suppress unwanted deposition on the walls of the chamber.

Still other aspects of the present invention provide methods of treating substrates, which methods desirably employ features as discussed above in connection with the reactor and injection head.

DETAILED DESCRIPTION

Figure 1:
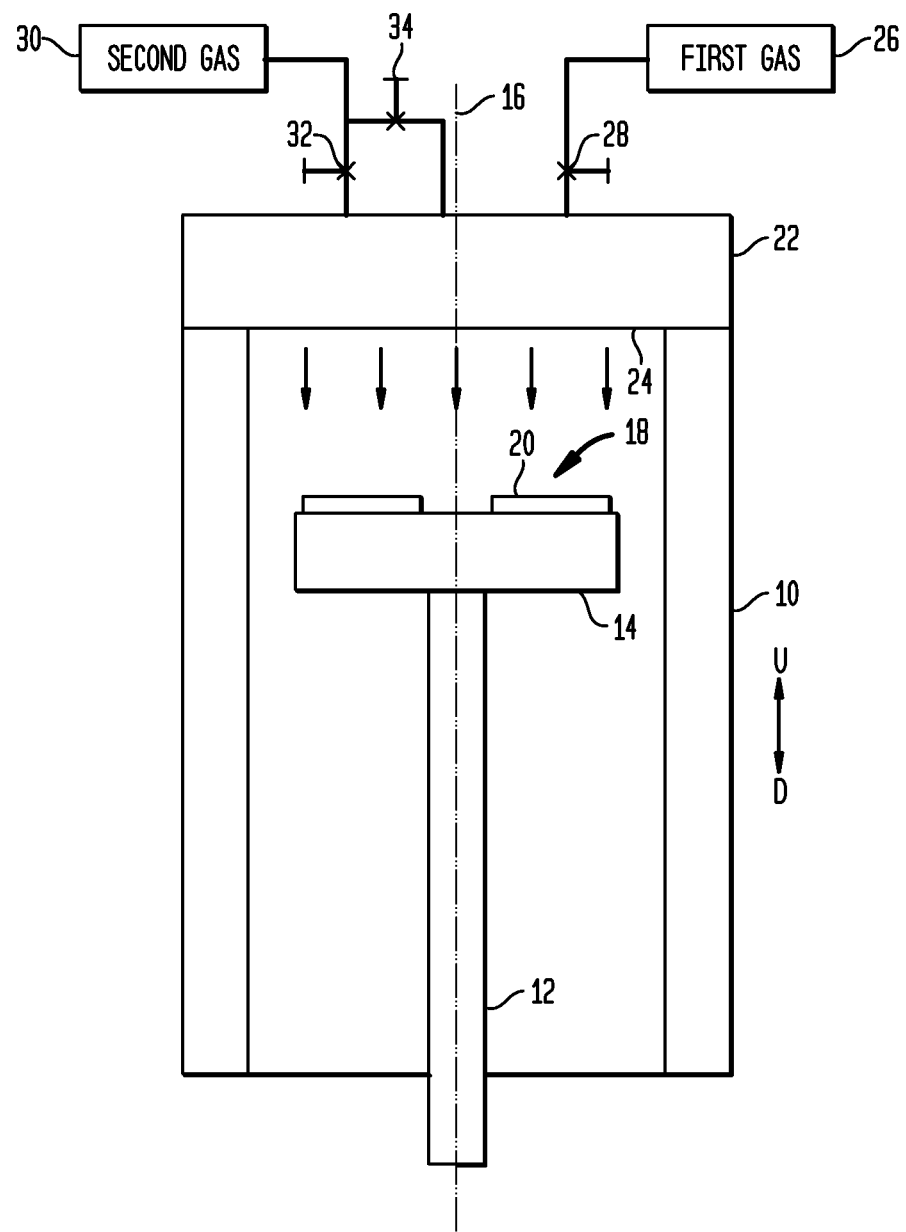
FIG. 1 is a simplified sectional view of a reactor according to one embodiment of the invention

Referring now to the drawings wherein like numerals indicate like elements, FIG. 1 shows a rotating disk reactor incorporating a multi-gas injector according to one embodiment of the present invention.

As diagrammatically shown in FIG. 1, the apparatus includes a generally cylindrical reaction chamber 10 which typically has walls formed from stainless steel or other material which is substantially non-reactive with the process gases. The reactor typically includes other components such as a base plate and exhaust ports (not shown). A spindle 12 and a generally disc-like wafer (substrate) carrier 14 are mounted for rotation about an axis 16 coaxial with the cylindrical chamber. Substrates such as wafers 18 are held on the wafer carrier with surfaces 20 of the substrates which are to be treated lying substantially perpendicular to the axis 16 and facing in an upstream direction along the axis indicated by arrow U.

The substrate carrier and substrates are maintained at an elevated temperature by conventional components not shown. For example a heating susceptor (not shown) mounted on the spindle may be heated by a set of electrical heating elements (not shown). The heating elements typically are made from a refractive metal such as but not limited to, for example, molybdenum, tungsten or rhenium and the like, or a non-metal such as graphite. In this system, heat is transferred from the heating elements to the susceptor and from the susceptor to the substrate carrier. The heating elements may be divided into multiple heating zones. The metal for heating elements may be selected based on the reaction to be performed and heating characteristics required for a particular reactor and chemical vapor deposition chamber. A heat shield is advantageously disposed below the heating elements and susceptor. Alternatively, the wafer carrier may be directly heated by the heating elements.

A gas distribution injector head 22 is located at the upstream end of the chamber (the end toward the top of the drawing as seen in FIG. 1). The gas distribution injector head includes structure which defines an inner surface 24 facing in the downstream direction indicated by arrow D in FIG. 1 (the direction along axis of rotation of the substrate carrier, toward the bottom of the drawing as seen in FIG. 1).

Figure 2:
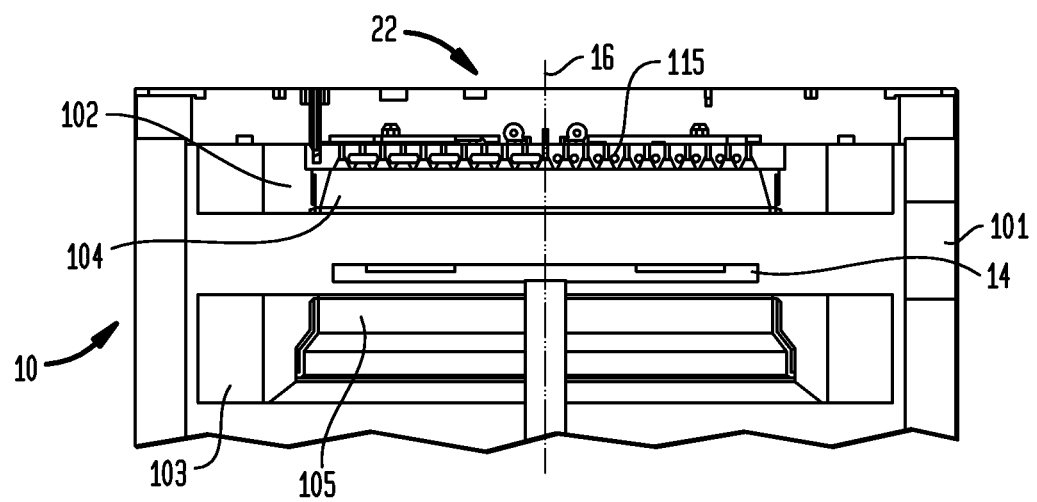
FIG. 2 is a diagrammatic view depicting certain components of the reactor shown in FIG. 1.
Figure 3:
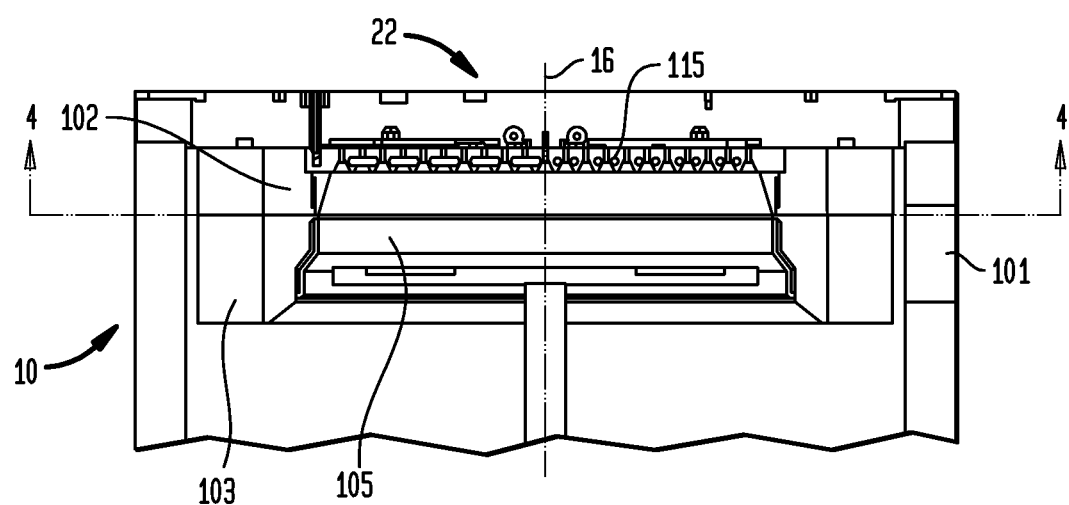
FIG. 3 is a view similar to FIG. 2 but depicting the components in a different operating condition.

Suitable arrangements such as an access port 101 (FIGS. 2 and 3) in the side or circumferential wall of the reactor are provided for loading and unloading wafers. In the particular embodiment depicted, the wafer carrier 14 is removable. A generally hoop-like shutter 103 is mounted for movement in the upstream and downstream axial directions. When the shutter 103 is in the retracted or open position depicted in FIG. 2, a wafer carrier 14 with treated wafers can be removed from the chamber and replaced by a new wafer carrier 14 bearing wafers to be treated. When the shutter 103 is in the advanced or closed position depicted in FIG. 3, it encircles the wafer carrier 14 and covers the access port 101. In this position, the shutter 103 forms part of the wall of the reaction chamber. The internal surfaces 105 of shutter 103 desirably are surfaces of revolution about the axis of rotation 16 of the wafer carrier. Shutter 103 desirably is provided with coolant passages (not shown) connected to a liquid coolant circulator for maintaining the temperature of the shutter at a temperature below that of the wafer carrier.

The reactor also includes a loop-like collar 102 referred to as a "confined inlet" element. Collar 102 defines an interior surface 104 which extends downstream from head 22 and forms a part of the reactor wall. Surface 104 is also in the form of a surface of revolution about axis 16 and flares slightly radially outwardly, away from the axis 16, in the downstream direction. When shutter 103 is in the advanced or closed position (FIG. 3) the surface 104 of collar 102 is substantially continuous with the inner surface 105 of the shutter 103. Collar 102 also may be provided with coolant passages.

Although an access port and shutter are described herein, other reactors may have other access systems, such as, for example, top-loading or bottom loading of wafers through a removable top or bottom portion of the reactor. The other features of the reactor not specifically discussed herein may be, for example, of the types used in reactors sold under the trademark TURBODISC by Veeco Instruments Inc.

Figure 4:
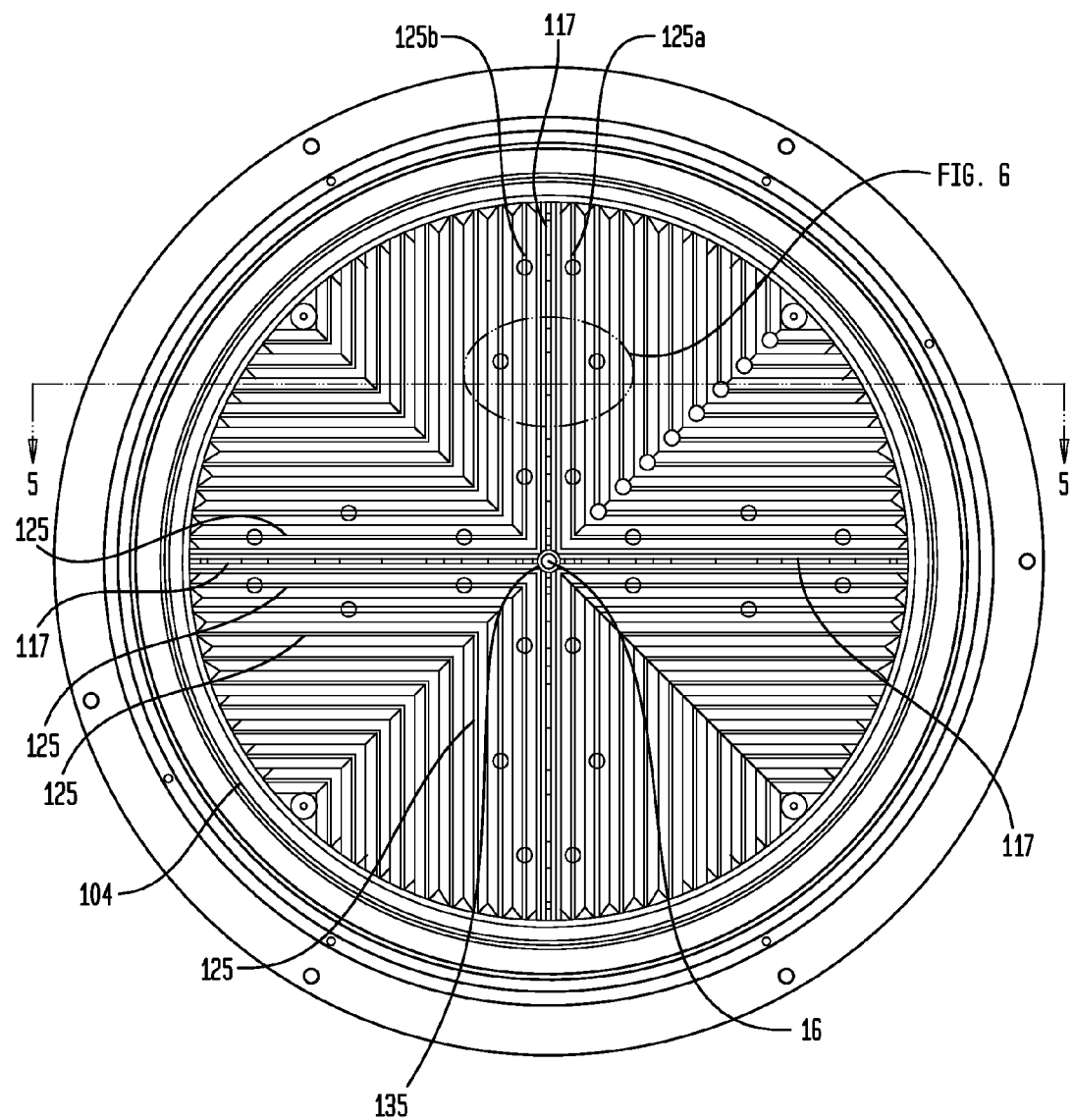
FIG. 4 is a sectional view taken along line 4-4 in FIG. 3.
Figure 5:
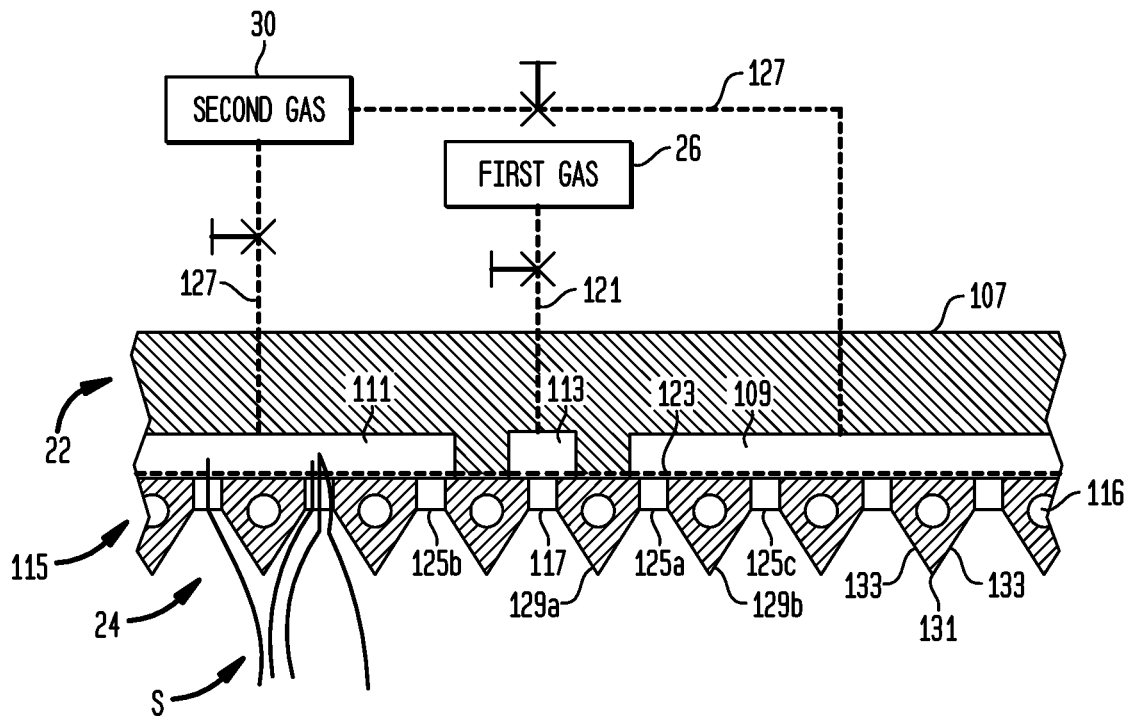
FIG. 5 is a diagrammatic sectional view taken along line 5-5 in FIG. 4.

As best seen in FIGS. 4 and 5, the gas distribution and injector head 22 includes a manifold assembly 107, which may be formed from one plate or, more typically, a plurality of plates superposed on one another. The manifold assembly 107 has recesses in its downstream surface defining gas conduits open to the downstream surface of the manifold assembly. A few of these gas conduits 109, 111, 113 are shown in FIG. 4. An element 115 referred to herein as a "cold plate" or "diffuser" overlies the downstream surface of manifold assembly 107. Cold plate 115 is provided with coolant passages 116 connected to a source of a circulating coolant. Cold plate 115 defines the downstream surface 24 of the distribution and injector head 22, i.e., the surface facing toward the bottom of the drawing in FIGS. 1-4. This surface is also referred to herein as the "inner" surface 24 of head 22. A screen 123 is provided between the cold plate 115 and manifold assembly 107. The screen has limited permeability or porosity.

Figure 6:
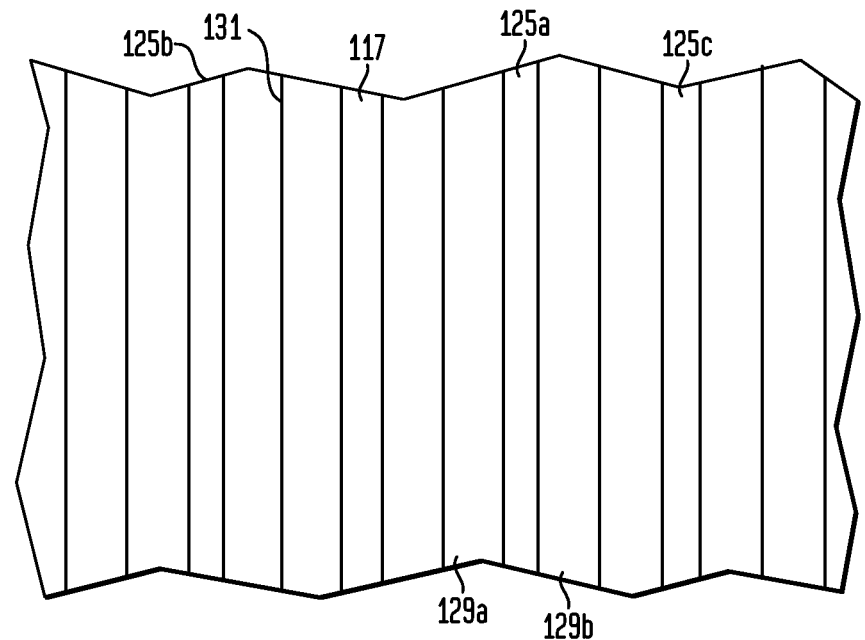
FIG. 6 is a fragmentary view, on an enlarged scale, of the area indicated in FIG. 4.

Cold plate 115 defines a plurality of first gas inlets 117. As best seen in FIGS. 4 and 6, each first gas inlet 117 is in the form of an elongated slot. Such slot forms a passageway which extends through cold plate 115 and communicates with the downstream or inner surface and thus defines an elongated port communicating with the interior of reaction chamber 10. The first gas inlets 117 are arranged along two rows denoted by broken lines in FIG. 5. The first gas inlets or slots 117 are also shown schematically in FIG. 7. The rows extend perpendicular to the axis 16 and perpendicular to one another, and cross one another at the axis. However, the elongated slots or first gas inlets 117 do not intersect at the axis 16. Each row of slots 117 may include two or more slots. For example, as shown schematically in FIG. 7, one row includes inboard slots 117a and 117b disposed near to, but not crossing, axis 16, and also includes slots 117c and 117d disposed further from the axis. Similarly, the other row includes radially inboard slots 117e and 117f, and radially outboard slots 117g and 117h.

The first gas inlets 117 communicate with some of the gas conduits in manifold assembly 107. These gas conduits are referred to herein as first gas conduits. For example, as seen in FIG. 4, first gas inlet 117 communicates with first gas conduit 113 through a portion of screen 123. The first gas conduits are connected, through internal connections of the manifold assembly, schematically illustrated by broken line 121 in FIG. 5, to a first gas source 26 Although the first gas source is shown in FIG. 1 as a single device with a single control element 28 in the form of a valve, first gas source and conduits may include more complex components arranged to supply the first gas with the same or different compositions and/or flow rates to different ones of the first gas inlets along the extent of the rows of first gas inlets. For example, the first gas conduits communicating with the radially inner first gas inlets 117a, 117b, 117e and 117f (FIG. 7) may be connected together to form an inner zone, whereas the gas conduits communicating with radially outboard slots 117c, 117d, 117g and 117h may be connected together to form a radially outboard zone. The first gas supply arrangement may be arranged to supply the first gas with different composition and/or flow rates in the radially inner and radially outer zones. The flow rates and compositions of the gases can be selected, for example, as discussed in PCT Publication WO 2005/019496, the disclosure of which is incorporated by reference herein, and in copending, commonly assigned U.S. patent application Ser. No. 11/544,075, published as U.S. Published Patent Application 2007-0134419 A1, the disclosure of which is also incorporated by reference herein. As discussed further in these publications, the first gas may include a reactive constituent such as, for example, an alkyl, and may include non-reactive carrier gases such as nitrogen or hydrogen. The composition of the first gas may be varied in different regions to include different proportions of carrier gases and thus match the density of the first gas to the density of the second gas discharged in the various regions. The flow rate may be varied so that the discharge velocity of the first gas matches the discharge velocity of the second gas.

The injector structure further defines a plurality of second gas field inlets 125, which are also in the form of elongated slots which extend through the cold plate 115. Each such slot terminates in an elongated port at the downstream end of the passageway open to the inner or downstream surface of cold plate 115. Thus, the second gas field inlets also communicate with the interior of chamber 10. The second gas field inlets are disposed in an array over the regions of the inner surface 24 (FIG. 1) which are not occupied by the rows of first gas inlets 117. The second gas field inlets 125 communicate through screen 123 with second gas conduits defined by the manifold assembly 107. For example, the inlets 125 depicted in FIG. 5 communicate with second gas conduits 109 and 111. The second gas conduits, and thus the second gas field inlets 125, are connected to one or more sources 30 of a second gas by internal connections 127 within the manifold assembly and through one or more control elements schematically depicted as valves 32. The second gas field inlets 125 and associated conduits may be subdivided into multiple zones which can be regulated independently, to provide the second gas with different composition and/or flow rate in different regions. For example, the second gas field inlets 125 at different radial distances from axis 16 can constitute different zones.

The second gas field inlets 125 are disposed in quadrants of the injector head around the axis between the rows of first gas inlets. As best seen in FIG. 5, the elongated slots constituting the second gas field inlets 125 within each quadrant extend parallel to one another. As shown in FIGS. 5 and 6, the elongated second gas field inlets 125 within each quadrant extend parallel to the row of first gas field inlets extending through that quadrant. Thus, the elongated slot constituting each first gas inlet 117 extends between two adjacent second gas field inlets 125a and 125b.

As best seen in FIGS. 4, 5 and 6, the cold plate 115 includes diffuser elements 129. Each diffuser element is in the form of an elongated blade having a generally triangular cross-section. Each such elongated blade lies between two elongated, slot-like gas inlets and extends parallel to those elongated inlets. For example, as seen in FIGS. 4 and 6, diffuser element or blade 129a lies between first gas inlet 117 and second gas field inlet 125a, whereas blade 129b lies between two second gas field inlets 125a and 125c. Each blade 129 tapers in the downstream direction to a relatively sharp edge 131 at the downstream extremity of the blade. Although any edge necessarily has a finite radius, the radius of edge 131 desirably is substantially less than 1 mm and desirably is so small that the radius plays no appreciable role in the dynamics of the discharged gases. The side surfaces 133 of the blades desirably extend all the way to the gas inlets.

The cold plate 115 desirably defines a center second gas inlet 135 in the form of a port mounted at axis 16. The second gas source 30 is also connected to the second gas center inlet 135 through further internal connections such as a second gas conduit (not shown) within manifold assembly 107 and through a control element 34 (FIG. 1) such as a valve which is separate from the control elements associated with the field second gas inlets 125. Thus, the flow rate of the second gas through the center inlet 135 can be controlled independently of the flow rate through the field inlets. Optionally, the composition of the second gas sent to the center inlet 135 also may be controllable independently of the composition of the second gas send to the field inlets 125. Any other device which can control the flow rate of the second gas can be used instead of the valves.

Figure 7:
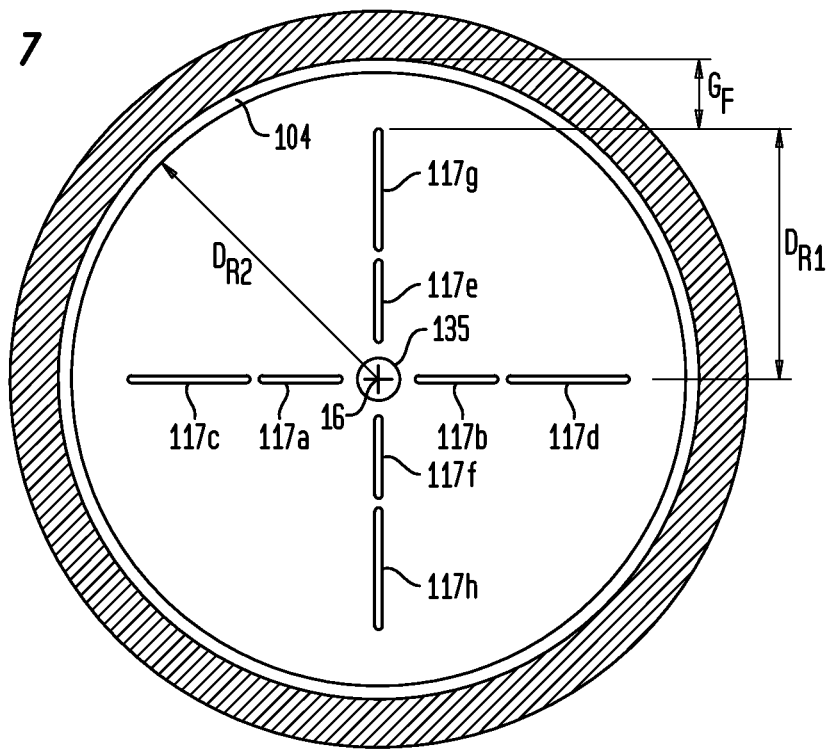
FIG. 7 is a view similar to FIG. 4, with certain elements omitted for clarity of illustration.

As best seen in FIG. 7, the rows of first gas inlets 117 terminate inboard of the reactor wall, i.e., inboard of the internal surface 104 of collar 102. Stated another way, the rows of first gas inlets extend to a first radial distance $D_{R1}$ from axis 16 which is less than the radius of the reactor vessel, thus leaving a gap or radial distance $G_f$ between the outboard end of each row and the wall of the reactor vessel. In this particular embodiment, the radius of the reactor vessel is defined by the internal surface 104 of the collar 102. The array of second gas field injectors 125 extends to a second radial distance $D_{R2}$ from the axis, the second radial distance $D_{R2}$ being greater than the first radial distance $D_{R1}$. As best seen in FIGS. 4 and 7, the array of second gas field injectors 125 extends nearly to the wall of the reactor, i.e., nearly to the internal surface 104 of collar 102. The first radial distance $D_{R1}$ may be smaller than the radius of the wafer carrier 14.

The apparatus discussed above can be made in essentially any size; most typically, the wafer carrier 14 is approximately 3 inches (7.6 cm) to approximately 18 inches (45.7 cm) in diameter or greater.

In operation, one or more wafers (substrates) 18 are held in the wafer (substrate) carrier 14 and maintained at an elevated temperature by the heating elements within the reactor. The wafer carrier 14 rotates about axis 16 at a rate β on the rotating spindle driven by motor. For example, β typically is about 500 RPM or higher, although the rate β may vary from approximately 300 RPM to 1500 RPM or higher. The temperature may vary from approximately 350° C. or lower to 1600° C. or higher. The optimum temperature depends on the particular material being grown. The appropriate first and second gasses to perform the desired treatment on the surfaces of the wafers 18 are introduced through head 22. Although a wide variety of treatments may be performed, the apparatus discussed above is most typically used for metalorganic chemical vapor deposition ("MOCVD"). For example, the apparatus may be used for MOCVD of a III-V semiconductor, in which the first gas includes as a reactive constituent one or more alkyls of one or more group III metals and the second gas includes as an active constituent a hydride of a group V element such as, for example, ammonia, arsine or the like. Because such a III-V deposition process is so commonly employed, the discussion below refers to such a process. Most typically, the flow rates may vary from approximately 5 liters/minute to 300 liters/minute. Pressure of the reactor typically ranges from approximately 25 Torr to 500 Torr or greater.

When the wafers (substrates) 18 are at the desired temperature for the deposition reaction, first gas source 26 is actuated to feed a first gas such as a gas containing a metal alkyl to the first gas inlets 117, and thereby discharge streams of a first gas generally downstream within chamber 10 from the first gas inlets 117. At the same time, the second gas source 30 is actuated to feed a second gas such as a gas containing a group V hydride to second gas field inlets 125, and thereby discharge streams of the second gas generally downstream, toward the substrates or wafers 18, from the second gas field inlets 125. The streams of first and second gasses need not be directed exactly downstream, exactly parallel with rotational axis 16. As the gases approach the rotating wafer carrier 14, they are impelled into a circumferential flow around axis 16, and also flow outwardly, away from axis 16 and toward the periphery of the wafer carrier. As the gases approach the wafer carrier 14, the gases mix with one another so that the gases react at and near the substrates such as to form a reaction product such as a III-V semiconductor that deposits on the exposed surfaces of the substrates.

The gases also tend to form unwanted deposits on components of the reactor itself. Several features of the present invention inhibit such unwanted deposition. Because the rows of first gas injectors 117 terminate radially inward from the reactor walls, the concentration of first gas in the gas which flows along the reactor walls is dramatically reduced and hence parasitic deposition on the wall is also reduced. For example, parasitic deposition on the inner surface 104 of collar 102 and on the inner surface 105 of shutter 103 is materially reduced. If the gap or radial distance $G_f$ (FIG. 7) between the outboard end of the first gas injector rows 117 and the reactor wall is too large, that portion of the gas flow which impinges on the outer edge of wafer carrier 14 and those portions of the substrates at the outer edge of the wafer carrier will be deficient in the second gas. For example, in a III-V compound semiconductor growth system, the growth rate at the periphery of the wafer carrier will be reduced because of insufficient alkyl concentration if $G_f$ is too large. However, by properly selecting $G_f$, the growth rate remains substantially constant over the entire radial extent of the wafer carrier. The optimum gap $G_f$ will vary with parameters such as the size of the reactor. However, for a reactor using a 465 mm diameter wafer carrier, using a gap $G_f$ of about 18 mm provides good results.

The tapered diffuser elements 129 substantially suppress unwanted deposition on the injector head 22. Although the present invention is not limited by any theory of operation, it is believed that this result is achieved by suppressing recirculation of the gases near the downstream surface 24 of the injector head 22. It is believed that the gases passing out of the first gas inlets 117 and second gas field inlets 125 pass out of the injector head 22 with flow as indicated by the smoothly spreading streamlines S shown in FIG. 5. In flow of this type, the gases from adjacent gas inlets merge into the desired uniform downward flow without eddies.

Placement of the first gas inlets 117 in two rows extending across the diameter of the reactor provides good mixing of the first gas with the second gas in the vicinity of the rotating wafer carrier, and helps to assure that there is an adequate proportion of the first gas throughout the circumferential extent of the wafer carrier. This improves the efficiency of the reaction and helps to promote optimized growth. If only one row of first gas injectors is used, the system will work, but the reaction will be less efficient in some locations remote from the single row. In a variant of this approach, more than two diametral rows can be used. For example, three diametral rows can be used. In a further variant, the first gas injectors may be provided as radial rows such as, for example, rows extending outwardly from the central axis along three or five radii.

The second gas center inlet 135 provides a source of the second gas, such as the group V hydride, directed at the center of the wafer carrier. This assures that there will be an adequate supply of the second gas, such as the hydride, in those regions of the wafer carrier near the central axis 16. The independent adjustability and control of the second gas flow through the central inlet 135 allows adjustment of the process to compensate for variations in process conditions such as convection or diffusion of the reactants. This, in turn, allows for improved deposition uniformity.

Figure 8:
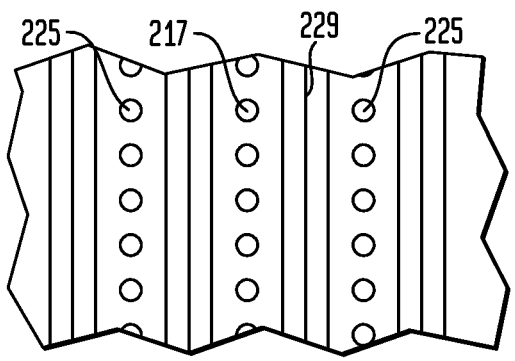
FIG. 8 is a view similar to FIG. 6, but depicting a portion of a reactor according to an alternate embodiment of the invention.
Figure 9:
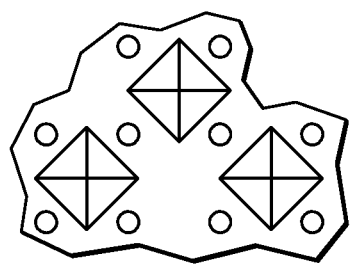
FIG. 9 is a view similar to FIG. 8, depicting a portion of a reactor according to yet another embodiment of the invention.

Numerous variations of the features discussed above can be employed. For example, as seen in FIG. 8, the gas inlets may be provided as rows of holes 217, 225 extending parallel to one another, rather than as elongated slots. In this embodiment, the diffuser elements 229 are disposed between holes of neighboring rows, but there are no diffuser elements between holes of the same row. In a further arrangement (FIG. 9) the diffuser elements may be pyramidal rather than blade-like.

While the embodiment discussed above is shown with a wafer carrier 14 for holding substrates 18 for reactive gas processing, such as deposition processes, it is envisioned that a wafer carrier 14 is not necessary and a substrate 18 may be placed directly on a rotating reactor surface such as a chuck, without a wafer carrier holding the substrate. The downstream direction as referred to herein and identified by arrow D is the direction from the gas distribution injector head 22 toward the wafer carrier 14; it need not be in any particular orientation relative to gravity. Although the embodiment discussed above shows the downstream direction D as being from the top of the chamber 10 towards the bottom of the chamber 10, the gas distribution injector head 22 may also be placed on the side of the chamber 10 (such that the downstream direction D is the direction from the side of the chamber 10 horizontally towards the center of the chamber 10), or the gas distribution injector head 22 may also be placed on the bottom of the chamber 10 (such that the downstream direction is the direction from the bottom of the chamber 10 upwards towards the center of the chamber 10). Also, in the embodiment discussed above with reference to FIG. 1, the exhaust ports (not shown) are described at being at the downstream end of the reaction chamber; the exhaust ports may be located on other portions of the reaction chamber.

In the embodiment discussed above, the two reactant gases are provided simultaneously. However, in other embodiments, the reactant gases are supplied sequentially and/or with overlapping pulses. For example, in atomic layer epitaxy, pulses of the reactant gases are applied in alternating sequence, so that a pulse of one carrier gas terminates before a pulse of another gas begins. In a process referred to as migration-enhanced epitaxy, pulses of the different carrier gases are supplied in alternating sequence but overlap one another in time. In a process using sequential reactant gas flows, carrier gas flow may be supplied simultaneously with one or more of the reactant gases.

The first and second gases may be any reactant gases suitable for performing any treatment operation on the substrates, including but not limited to those for use in a chemical vapor deposition process as discussed above. Reactant gases in various embodiments may include any gas, vapor, or material which participates in the treatment of a substrate within the reactor. More particularly, the reactant gas may be any gas that is suitable for treating the substrate surface. For example, where the desired deposition is growth of a semiconductor layer such as in epitaxial layer growth, the reactant gasses may be a mixture of plural chemical species, and may include inert, non-reactant gas components. Either or both of the reactant gases may include a combination of gases, such as a reactive component and a non-reactive gas. The reactors and processes discussed above can be applied, for example, to formation of III-V semiconductors such as but not limited to GaAs, GaP, $GaAs_{1-x}P_x$, $Ga_{1-y}Al_yAs$, $Ga_{1-y}In_yAs$, AlAs, AlN, InAs, InP, InGaP, InSb, GaN, InGaN, and the like. Moreover, these reactors can also be applied to other systems, including formation of Group II-VI compounds, such as but not limited to ZnSe, CdTe, HgCdTe, CdZnTe, CdSeTe, and the like; Group IV materials such as SiC, diamond, and SiGe; as well as oxides, such as YBCO, BaTiO, $MgO_2$, ZrO, $SiO_2$, ZnO and ZnSiO. The reactors and processes discussed above can be applied to deposition of other materials such as metals, such as Al, Cu and W. Furthermore, the resultant materials will have a wide range of electronic and opto-electronic applications, including but not limited to light emitting diodes (LED's), lasers, solar cells, photocathodes, HEMT's and MESFET's. In yet another variant, the gases supplied in the reactor may perform treatments other than deposition such as, for example, a reactive etching process.

Although the reactor of FIG. 1 is shown as a vertical rotating disk reactor 10, this reactor is only provided as an example, and it is understood that various features of the present invention can be used with other types of reactors such as non-rotating disk reactors, lateral flow reactors, rotating injector reactors, and the like. Additionally, additional reactant gases may be supplied to the chamber via one or more supplementary gas sources, gas chambers and gas inlets. The patterns and structures described herein can thus be readily extended to three, four or more precursors along with one or more carrier gases.

The present invention has industrial application in manufacture of semiconductors and related articles.

As these and other variations and combinations of the features discussed herein can be employed, the foregoing description of the preferred embodiments should be taken by way of illustration rather than by way of limitation of the present invention.

The invention claimed is:

1. A method of treating one or more substrates comprising:
   (a) rotating a holder carrying the substrates about an axis while maintaining surfaces of the substrates substantially perpendicular to the axis and facing in an upstream direction along the axis; and, during the rotating step,
   (b) discharging a first gas in the downstream direction toward the substrates as a first gas stream extending across the axis in a first radial direction perpendicular to the axis and as a second gas stream extending perpendicular to the axis in a second radial direction perpendicular to the first radial direction;
   (c) simultaneously discharging a second gas in the downstream direction toward the substrates as third gas streams disposed around the axis between the first and second gas streams; and
   (d) discharging the second gas in the downstream direction toward the substrates from a center inlet disposed substantially on the axis.

2. A method as claimed in claim 1 further comprising controlling the discharge of the second gas from the center inlet independently of the discharge of the third gas streams.

3. A method as claimed in claim 1, wherein the first and second gas streams extend to a first radial distance from the axis, and the third gas streams extend to a second radial distance from the axis greater than the first radial distance.

4. A method as claimed in claim 3 wherein the first and second gas streams are discharged from first and second rows of first gas inlets arranged perpendicular to each other and perpendicular to the axis, and the third gas streams are discharged from gas field inlets disposed around the axis between the first and second rows of first gas inlets.

5. A method as claimed in claim 4, wherein the discharging steps are performed via an injector head having a perimeter and a series of the first gas inlets and the gas field inlets, a center of the injector head being coaxial with the axis, and wherein the first gas inlets are arranged between the center and the first radial distance, and the gas field inlets are disposed between the center and the second radial distance, at least some gas field inlets being situated between the first and the second radial distance.

6. A method as claimed in claim 4, further comprising arranging the gas field inlets into a plurality of zones, and regulating an amount of the second gas discharged from at least a first of the plurality of zones independently of an amount of the second gas discharged from a second of the plurality of zones.

7. A method as claimed in claim 3 wherein the first radial distance is less than the radius of the holder.

8. A method as claimed in claim 7 wherein the rotating and discharging steps are performed within a reactor vessel having internal wall surfaces in the form of surfaces of revolution coaxial with the axis.

9. A method as claimed in claim 3, further comprising causing the first through third gas streams to mix and establish a mixture having first and second sections, the first section extending from the axis to the first radial distance and having a first concentration of the first gas, and the second section being positioned past the first radial distance and having a second lower concentration of the first gas.

10. A method as claimed in claim 9, wherein the rotating and discharging steps are performed within a reactor vessel having internal wall surfaces, and wherein the second section of the mixture is positioned near the internal wall surfaces of the reactor so that unwanted deposition on the internal wall surfaces is mitigated.

11. A method as claimed in claim 1, wherein the second gas is reactive with the first gas.

12. A method as claimed in claim 11, wherein the rotating step is performed at a speed to impel the first through third gas streams into rotational flow so that the first and second gasses mix and react with one another.

13. A method of treating one or more substrates comprising:
   (a) rotating a holder carrying the substrates about an axis while maintaining surfaces of the substrates substantially perpendicular to the axis and facing in an upstream direction along the axis; and, during the rotating step, (b) discharging a first gas in the downstream direction toward the substrates as a first gas stream extending across the axis in a first radial direction perpendicular to the axis and as a second gas stream extending perpendicular to the axis in a second radial direction; and (c) simultaneously discharging a second gas reactive with the first gas in the downstream direction toward the substrates as third gas streams disposed around the axis between the first and second gas streams, wherein the rotating step is performed at a speed to impel the first through third gas streams into rotational flow so that the first and second gasses mix and react with one another.

14. A method as claimed in claim 13, wherein the second radial direction is perpendicular to the first radial direction.

15. A method as claimed in claim 13, wherein the third gas streams are discharged from gas field inlets arranged into a plurality of zones, and within each zone the gas field inlets extend parallel to one another.

16. A method as claimed in claim 13, wherein the first and second gas streams extend to a first radial distance from the axis, and the third gas streams extend to a second radial distance from the axis greater than the first radial distance.

17. A method as claimed in claim 16, wherein when the first and second gasses mix, they establish a mixture having first and second sections, the first section extending from the axis to the first radial distance and having a first concentration of the first gas, and the second section being positioned past the first radial distance and having a second lower concentration of the first gas.

18. A method as claimed in claim 17, wherein the rotating and discharging steps are performed within a reactor vessel having internal wall surfaces, and wherein the second section of the mixture is positioned near the internal wall surfaces of the reactor so that unwanted deposition on the internal wall surfaces is mitigated.

19. A method as claimed in claim 13, wherein the third gas streams are discharged from gas field inlets arranged into a plurality of zones, and the method further comprises regulating an amount of the second gas discharged from at least a first of the plurality of zones independently of an amount of the second gas discharged from a second of the plurality of zones.

* * * * *